United States Patent [19]

Jang

[11] Patent Number: 5,696,022

[45] Date of Patent: Dec. 9, 1997

[54] METHOD FOR FORMING FIELD OXIDE ISOLATION FILM

[75] Inventor: Se Aug Jang, Bubaleub, Rep. of Korea

[73] Assignee: Hyundai Electronics Industries Co., Ltd., Kyoungkido, Rep. of Korea

[21] Appl. No.: 632,706

[22] Filed: Apr. 15, 1996

Related U.S. Application Data

[63] Continuation of Ser. No. 365,821, Dec. 28, 1994, abandoned.

[30] Foreign Application Priority Data

Dec. 29, 1993 [KR] Rep. of Korea ............... 1993-30824

[51] Int. Cl.$^6$ ............................................. H01L 21/76
[52] U.S. Cl. ............................................. 437/72
[58] Field of Search ............... 437/72; 148/DIG. 117, 148/DIG. 85, DIG. 86

[56] References Cited

U.S. PATENT DOCUMENTS 5,118,641  6/1992  Roberts.

FOREIGN PATENT DOCUMENTS

| 58-168264 | 10/1983 | Japan. |
|---|---|---|
| 60-21541 | 2/1985 | Japan. |
| 61-294840 | 12/1986 | Japan. |
| 1437112 | 5/1976 | United Kingdom. |

OTHER PUBLICATIONS

Martin, R., "Spacer for Improved Local Oxidation Profile", IBM Tech. Disc. Bull., 1987, vol. 12, No. 5, pp. 251–253.

*Primary Examiner*—George Fourson
*Attorney, Agent, or Firm*—Merchant, Gould, Smith, Edell, Welter & Schmidt, P.A.

[57] ABSTRACT

A method for forming a field oxide film for element isolation of a structure extending deeply in the substrate and having a step of small height, thereby exhibiting a low topology and a reduced bird's beak. The method includes the steps of forming a pattern of a mask material film for an oxidation prevention on a semiconductor substrate, locally forming an oxide film on a predetermined surface portion of the semiconductor substrate by use of an oxidation using the pattern as a mask, and removing the oxide film, thereby etching the predetermined surface portion of the semiconductor substrate while forming an undercut at a region defined beneath a side wall of the mask material film pattern, forming a lateral oxidation prevention film on the undercut disposed beneath the side wall of the mask material film pattern, and forming an oxide film for an element isolation, by use of an oxidation, on a portion of the semiconductor substrate exposed upon etching the predetermined surface portion of the semiconductor substrate.

11 Claims, 3 Drawing Sheets

METHOD FOR FORMING FIELD OXIDE ISOLATION FILM

This is a Continuation of application Ser. No. 08/365,821, filed Dec. 28, 1994 now abandoned.

BACKGROUND OF THE INVENTION

1. Field of the Invention

The present invention relates to a method for forming an element isolation film (field oxide film) of a semiconductor device, and more particularly to a method for forming an element isolation film of a semiconductor device using a local oxidation of silicon (LOCOS) process.

2. Description of the Prior Art

Generally, semiconductor devices require formation of a field oxide film adapted to provide an isolation between adjacent cells. In order to form such a field oxide film, there has been used the LOCOS process which involves forming a mask material pattern for oxidation prevention on a semiconductor substrate and locally oxidizing a portion of the substrate not covered with the mask material. As well known, a modified LOCOS process using a nitride spacer has also been used in order to prevent a bird's beak phenomenon resulting in a reduced active region.

Where the modified LOCOS process using the nitride spacer is used, an element isolation region defined is reduced by the width of the nitride spacer. As a result, the volume of a field oxide film formed beneath the upper surface of a semiconductor substrate corresponds merely to about 40% of the total volume. This results in a severe field oxide thinning phenomenon such that the field oxide film is greatly reduced in thickness. Consequently, a degradation in electrical element isolation characteristic occurs.

SUMMARY OF THE INVENTION

Therefore, an object of the invention is to provide a method for forming an element isolation film of a semiconductor device, capable of preventing a field oxide film thinning phenomenon and yet reducing a bird's beak phenomenon, thereby obtaining an increased active region and a good element isolation.

In accordance with the present invention, this object can be accomplished by providing a method for forming an element isolation film of a semiconductor device, comprising the steps of: forming a pattern of a mask material film for an oxidation prevention on a semiconductor substrate; locally forming an oxide film on a predetermined surface portion of the semiconductor substrate by use of an oxidation using the pattern as a mask, and removing the oxide film, thereby etching the predetermined surface portion of the semiconductor substrate while forming an undercut at a region defined beneath a side wall of the mask material film pattern; forming a lateral oxidation prevention film on the undercut disposed beneath the side wall of the mask material film pattern; and forming an oxide film for an element isolation, by use of an oxidation, on a portion of the semiconductor substrate exposed upon etching the predetermined surface portion of the semiconductor substrate.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1A to 1I illustrate respectively a method for forming a field oxide film of a semiconductor device in accordance with an embodiment of the present invention.

Figure 1A:
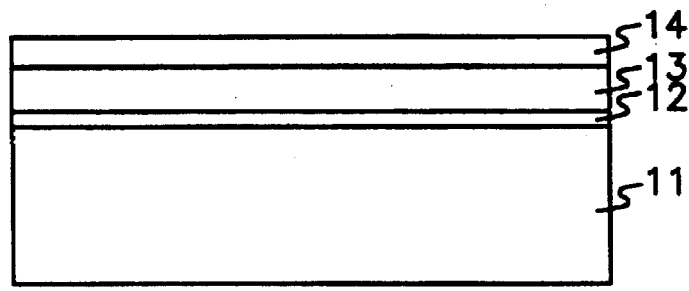
FIGS. 1A to 1I are sectional views respectively illustrating a method for forming a field oxide film of a semiconductor device in accordance with an embodiment of the present invention.

In accordance with this method, first, a silicon substrate 11 is oxidized to form a pad oxide film 12 thereon, as shown in FIG. 1A. Subsequently, a nitride film 13 and a chemical vapor deposition (CVD) oxide film 14 are sequentially formed over the pad oxide film 12.

Figure 1B:
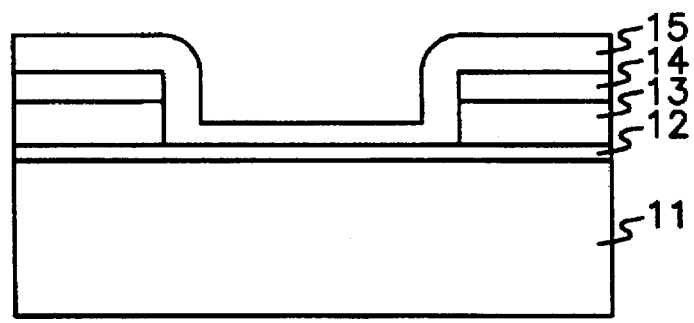

Thereafter, predetermined portions of the CVD oxide film 14 and nitride film 13 are etched until the pad oxide film 12 is exposed, thereby defining a field region, as shown in FIG. 1B. Over the entire exposed surface of the resulting structure, a nitride film 15 is deposited to a thickness of 500 to 1,500 Å.

Figure 1C:
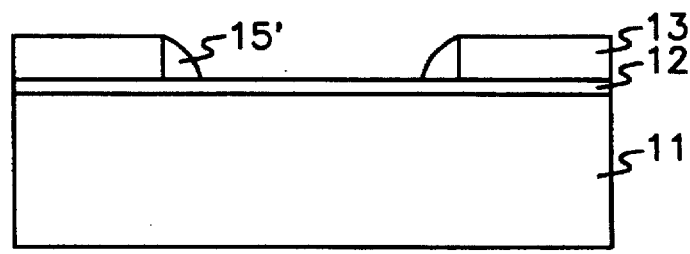

As shown in FIG. 1C, the nitride film 15 is subjected to a spacer etch, thereby forming nitride spacers 15'. During the spacer etch, the CVD oxide film 14 is completely removed so that the nitride film 13 maintains its original thickness.

Figure 1D:
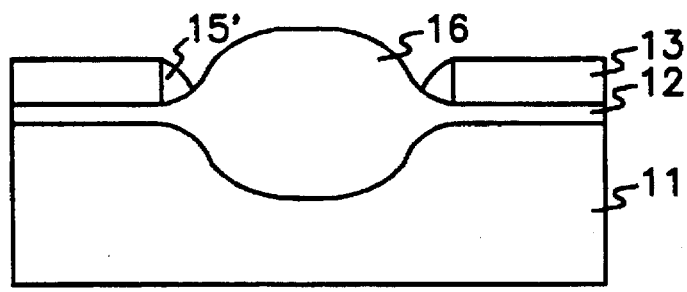

Subsequently, an oxidation is carried out to locally form an oxide film 16 having a thickness of 1,500 to 3,000 Å, as shown in FIG. 1D.

Figure 1E:
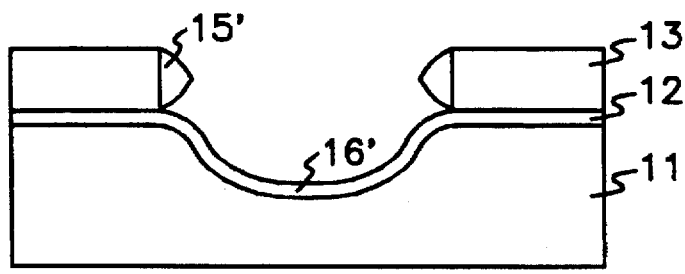

The oxide film 16 is then partially removed using a wet etching, thereby leaving only a portion 16' of the oxide film 16, as shown in FIG. 1E. At this time, each of the nitride film spacers 15' have a slightly raised shape such that an undercut region is defined thereunder.

Figure 1F:
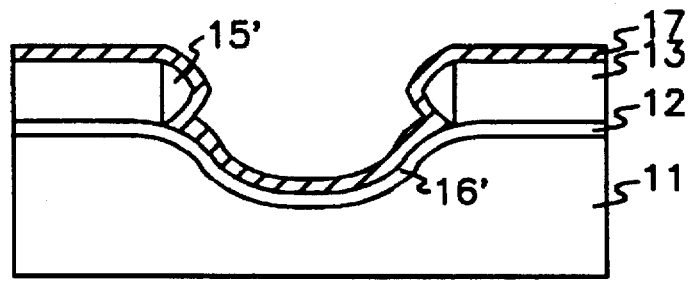
Figure 1G:
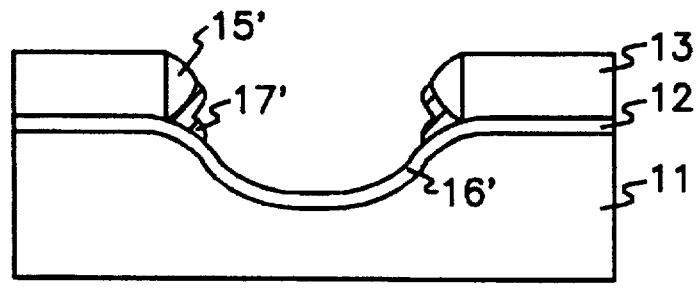

Over the entire exposed surface of the resulting structure, a thin film 17 comprised of a nitride film is deposited to a thickness of 50 to 150 Å, as shown in FIG. 1F. In place of the nitride film, the thin film 17 may be comprised of an oxynitride film As shown in FIG. 1G, the thin nitride film 17 is then dry etched so as to leave only its portions 17' respectively disposed at the undercut regions beneath the nitride film spacers 15'.

Figure 1H:
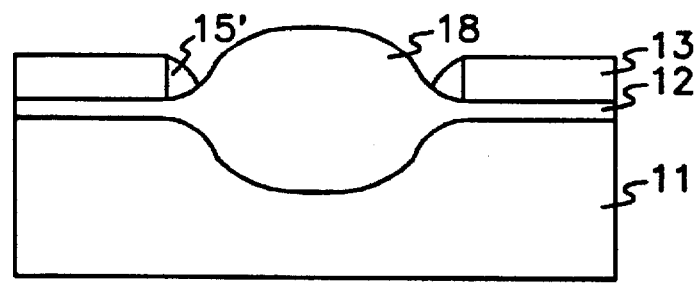

Thereafter, an oxidation is carried out to locally form a field oxide film 18, as shown in FIG. 1H. During the oxidation, any lateral diffusion of oxide through the pad oxide film 12 is inhibited by virtue of the thin film nitride film portions 17' respectively left on the undercut regions beneath the nitride film spacers 15' As a result, a bird's beak phenomenon is avoided.

During the oxidation, the thin nitride films 17' are removed as it is oxidized. Accordingly, any separate removal step for the thin nitride film is unnecessary.

Figure 1I:
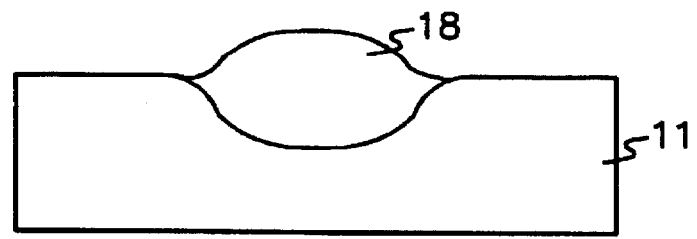

Finally, removal of the nitride film 13, the nitride film spacers 15' and the pad oxide film 12 are carried out, as shown in FIG. 1I. In FIG. 1I, the shape of the field oxide film 18 obtained after the removal of films 12, 13 and 15'.

Although the thin nitride film 17 is used to fill the undercut regions defined beneath the nitride film spacers 15', a polysilicon film having a thickness of 300 to 700 Å, may be used for the same purpose.

As apparent from the above description, the method of the present invention forms a field oxide film for element isolation of a structure deeply buried in the substrate and having a step of small height, thereby exhibiting a low topology and a reduced bird's beak. As a result, it is possible to improve the high integration and the characteristic of a semiconductor device finally fabricated.

Although the preferred embodiments of the invention have been disclosed for illustrative purposes, those skilled in the art will appreciate that various modifications, additions and substitutions are possible, without departing from the scope and spirit of the invention as recited in the accompanying claims.

What is claimed is:

1. A method of forming an element isolation film of a semiconductor device formed on a semiconductor substrate, the method comprising the steps of:

(a) forming a first patterned film of a first mask material on said semiconductor substrate, said first patterned film having a side wall defining an exposed field region;

(b) forming a spacer on said side wall of said first patterned film;

(c) oxidizing said semiconductor substrate to locally form a first field oxide film on said exposed field region using said first patterned film of said first mask material and said spacer as an oxidation mask to inhibit formation of said first oxide film beneath said first patterned film;

(d) removing at least a portion of said first field oxide film such that an undercut region is formed beneath said spacer;

(e) forming a lateral oxidation prevention film in said undercut region;

(f) oxidizing said semiconductor substrate to form a second field oxide film, said spacer, said lateral oxidation prevention film and said first patterned film being used as an oxidation mask, said lateral oxidation prevention film inhibiting forming said second field oxide film beneath said first patterned film thereby limiting formation of Bird's Beak; and (g) removing said spacer, said lateral oxidation prevention film, and said first patterned film while leaving at least some of said second field oxide film to form said element isolation film.

2. A method as recited in claim 1, wherein the forming step (e) comprises the steps of:

(i) forming a film of a second mask material over an entire exposed surface of a structure remaining after the removing step (d); and (ii) dry etching said second mask material leaving a portion of the second mask material disposed on an exposed interface between said semiconductor substrate and said first patterned film as said lateral oxidation prevention film.

3. A method as recited in claim 1, wherein said lateral oxidation prevention film is comprised of a nitride film.

4. A method as recited in claim 2, wherein said second mask material is comprised of a nitride film.

5. A method as recited in claim 1, wherein said lateral oxidation prevention film is comprised of a polysilicon film.

6. A method as recited in claim 2, wherein said second mask material is comprised of a polysilicon film.

7. A method as recited in claim 3, wherein said nitride film is formed to a thickness of 50 to 150 Å.

8. A method as recited in claim 4, wherein said nitride film is formed to a thickness of 50 to 150 Å.

9. A method as recited in claim 5, wherein said polysilicon film is formed to a thickness of 300 to 700 Å.

10. A method as recited in claim 6, wherein said polysilicon film is formed to a thickness of 300 to 700 Å.

11. A method as recited in claim 1, wherein the removing step (d) comprises the step of leaving a portion of said first oxide field film in said exposed field region.

* * * * *